(12) United States Patent
Korobochko et al.

(10) Patent No.: US 7,072,370 B2
(45) Date of Patent: Jul. 4, 2006

(54) ARRANGEMENT FOR GENERATING PULSED CURRENTS WITH A HIGH REPETITION RATE AND HIGH CURRENT STRENGTH FOR GAS DISCHARGE PUMPED RADIATION SOURCES

(75) Inventors: Vladimir Korobochko, Goettingen (DE); Denis Bolshukhin, Goettingen (DE); Lutz Dippmann, Bovenden (DE); Spencer Merz, Brookline, MA (US); Hubertus Von Bergmann, Stellenbosch (ZA); Juergen Kleinschmidt, Goettingen (DE)

(73) Assignee: XTREME technologies GmbH, Jena (DE)

( * ) Notice: Subject to any disclaimer, the term of this patent is extended or adjusted under 35 U.S.C. 154(b) by 0 days.

(21) Appl. No.: 11/020,749

(22) Filed: Dec. 22, 2004

(65) Prior Publication Data

US 2005/0200304 A1   Sep. 15, 2005

(30) Foreign Application Priority Data

Dec. 23, 2003  (DE) ................................ 103 61 908

(51) Int. Cl.
*H01S 3/00* (2006.01)

(52) U.S. Cl. ............... 372/38.1; 372/38.03; 372/38.04; 372/76; 372/70

(58) Field of Classification Search ............... None
See application file for complete search history.

(56) References Cited

U.S. PATENT DOCUMENTS

| 5,729,562 | A | 3/1998 | Birx et al. | |
| 2002/0015430 | A1* | 2/2002 | Osmanow et al. | 372/55 |
| 2002/0163313 | A1 | 11/2002 | Ness et al. | |
| 2004/0004987 | A1* | 1/2004 | Desor et al. | 372/57 |
| 2004/0202219 | A1* | 10/2004 | Govorkov et al. | 372/55 |
| 2005/0013338 | A1* | 1/2005 | Hofmann et al. | 372/55 |

FOREIGN PATENT DOCUMENTS

| DE | 33 35 690 | 3/1986 |
| DE | 101 51 080 | 12/2002 |

\* cited by examiner

*Primary Examiner*—Tuyet Thi Vo
(74) *Attorney, Agent, or Firm*—Reed Smith LLP

(57) ABSTRACT

The invention is directed to an arrangement for generating pulsed currents for gas discharge pumped radiation sources, particularly with high repetition rates and high current strengths for generating plasma emitting EUV radiation. The object of the invention, to find a novel possibility for generating pulsed high-energy currents for a gas discharge pumped radiation source which permits a stable generation of high voltage and a reliable resetting of voltage using simple circuitry, is met according to the invention in that the charging circuit is an LC inversion charging circuit which communicates with a DC voltage source that provides only one half of the high voltage required for the gas discharge, wherein the inversion charging circuit has a capacitor bank with a first capacitor arranged directly parallel to the DC voltage source and a second capacitor which contributes after simultaneous charging to the recharging of the first capacitor by a triggered switch by a saturable recharging inductor for recharging the first capacitor, as a result of which the full high voltage required for discharging is provided in the capacitor bank.

28 Claims, 9 Drawing Sheets

ARRANGEMENT FOR GENERATING PULSED CURRENTS WITH A HIGH REPETITION RATE AND HIGH CURRENT STRENGTH FOR GAS DISCHARGE PUMPED RADIATION SOURCES

CROSS-REFERENCE TO RELATED APPLICATION

This application claims priority of German Application Serial No. 103 61 908.9, filed Dec. 23, 2003, the complete disclosure of which is hereby incorporated by reference.

BACKGROUND OF THE INVENTION a) Field of the Invention

The invention is directed to an arrangement for generating pulsed currents for gas discharge pumped radiation sources, particularly with high current strengths (e.g., 10 to 50 kA at voltages of several kV). The electrical pulses with high repetition rates (preferably 1 Hz to more than 5 kHz with energies of 5 to 20 J) serve to generate a hot plasma which emits light in the EUV range. The invention is advantageously applicable in all electrical discharge methods for plasma generation such as Z pinch, hollow cathode, capillary and plasma focus discharges.

b) Description of the Related Art

In the semiconductor industry, photolithography methods in which a scanner contains a mask (with the structure to be imaged) that is imaged in a reduced manner (typically 1:5) on the wafer are currently applied for the fabrication of microchips. In addition to special lamps, narrow-band excimer lasers with wavelengths of 248 nm and 193 nm are principally used as radiation sources for exposure. Scanners based on F2 lasers (157 nm) are in development.

For the next generation of lithography machines, exposure with EUV sources at wavelengths around 13.5 nm appears to be the most promising variant for generating even smaller structures on the wafer. It is known for this purpose to use a plasma as the source of the EUV radiation. This plasma can be generated by means of focused laser radiation or by an electrical discharge.

A gas discharge pumped Z pinch plasma pertains to a gas discharge with cylindrical geometry in which the plasma is generated by a high current flow and by magnetic compression is pinched to form a thin thread of about 1 mm. Average plasma energies of greater than 30 eV are achieved.

In order to achieve a high sample throughput in chip fabrication with EUV lithography, a power of several hundred watts is required. This requires EUV radiation pulses of about 10 mJ per detected solid angle at repetition rates of greater than 5 kHz.

Apart from the characteristics of the optical system (numerical aperture, depth of focus, aberrations or imaging errors of the lenses or mirrors) and the structure of the resist material, the image quality of photolithographic methods is essentially determined by how accurately the radiated radiation dose can be maintained. This dose stability, or dose accuracy, is determined by:

a) pulse quantization;
b) pulse-to-pulse stability; and
c) spatial stability of the emitting volume.

Pulse quantization (a) is scanner-specific, since the quantity of light pulses that can fall into the exposure gap (moving slit) during an exposure process (scan) can vary. However, this factor can usually be ignored.

Contributing factors b and c are specific to the radiation sources themselves. Factor c is significant only for EUV sources.

The requirements of chip manufacturers with respect to dose stability at the site of the wafer set extremely high demands on pulse-to-pulse stability. This is expressed as a standard deviation σ of the actual light pulse energy from the average of the light pulse energy or from the targeted pulse energy (set energy value). In DUV lithography and VUV lithography, σ-values of less than 1.5% are permitted for narrow-band excimer lasers, whereas in EUV lithography σ-values of less than 0.4% are required. These limits can be adhered to only by means of special energy regulation; even when unregulated, the σ-values must be less than 3%.

All of these demands, high EUV output and low σ-values, translate to high requirements on the electric power supply for an EUV radiation source of this type.

A high-power pulsed current supply is known from U.S. patent application 2002/01633133 A1, which discloses a circuit for pulsed generation of EUV sources and x-ray sources for generating electrical pulses of at least 12 J at a repetition rate of at least 2 kHz. The circuit arrangement contains a capacitor bank, a fast resonant charging circuit which charges the capacitor bank, a control circuit which monitors the charge voltage, and a trigger circuit by which the capacitor bank is discharged in a magnetic compression circuit in order to generate light pulses in the EUV or x-ray range with a time constant of less than 10 ns.

This solution is disadvantageous in that a powerful transformer (usually oil-cooled) is required for generating the high discharge voltage and the resetting of the magnetic compression circuit must be carried out by an elaborate external bias circuit. Further, as a result of the relatively low high voltage (up to about 1.3 kV), the total capacitance of the storage banks must be greater than 24 µF with the given stored energy (approximately 20 J) and the high voltage can only be recharged in a controlled manner by means of a plurality of switches and a large inductor. The charging voltage stability is accordingly dependent upon the resonant charging circuit and the attainable repetition frequency has a ceiling imposed by the time constant of the resonant recharging process.

OBJECT AND SUMMARY OF THE INVENTION

It is the primary object of the invention to find a novel possibility for generating pulsed high-energy currents for a gas discharge pumped radiation source, i.e., electrical pulses of sufficient energy and repetition rate, which permits a stable generation of high voltage and a reliable resetting of voltage using simple circuitry.

In an arrangement for generating pulsed currents for gas discharge pumped radiation sources with a combination of a voltage source, a charging circuit for a capacitor bank for generating voltage pulses, a magnetic compression circuit for shortening the pulse duration of the voltage pulses, a discharge chamber with two electrodes for the gas discharge, and a trigger unit for controlling the voltage pulse sequence, the above-stated object is met according to the invention in that the charging circuit is an LC inversion charging circuit which communicates with a DC voltage source that provides only one half of the high voltage required for the gas discharge, in that the LC inversion charging circuit has two capacitors forming a capacitor bank, wherein a first capacitor of the capacitor bank is arranged directly parallel to the DC voltage source and a second capacitor of the capacitor bank can be charged simultaneously by a nonsaturable charging inductor, and in that the first capacitor can be recharged by means of a switch communicating with the trigger unit by a saturable recharging inductor, wherein, after charging with the switch closed, a recharging of the first capacitor takes place with the switch open, as a result of which the full high voltage required for triggering a current pulse is provided at the capacitor bank, this current pulse being provided by means of the magnetic compression circuit for transfer to the electrodes for the gas discharge in the discharge chamber.

The switch for recharging the first capacitor is advantageously a semiconductor switch. It preferably comprises one or more IGBT switches (Insulated Gate Bipolar Transistors), but can also contain thyristors or can be a gas discharge switch. A thyratron or a triggered spark gap can advisably also be used as switches.

The magnetic compression circuit advantageously comprises a plurality of compression stages with saturable inductors and a capacitor bank therebetween for temporary storage of the voltage pulses.

It is advantageous when the capacitor banks are constructed in a modular manner and are preferably formed of ceramic capacitors. However, the capacitor banks can also advisably be composed of foil capacitors.

In order to recover unused, reflected energy from the discharging circuit with minimal interference, an auxiliary circuit for energy recovery of reflected discharge voltage that is reflected in the buffer-storage capacitor bank of the compression circuit after every gas discharge is advantageously provided between the DC voltage source for providing half of the discharge high voltage and the capacitor bank of the inversion charging circuit, this auxiliary circuit containing a RL circuit with a diode for the first capacitor and/or a RL circuit with a diode for the second capacitor.

In case the DC voltage source that is used is not outfitted with a mains power supply with integrated protection circuit and internal buffer capacity for measuring (and/or stabilizing) the high output voltage, the auxiliary circuit advisably contains an additional capacitor in parallel with the DC voltage source, a first RL circuit connected to the common terminal of the first capacitor and second capacitor of the inversion charging circuit with diodes blocking relative to the two poles of the DC voltage source and the additional capacitor, and a second RL circuit with diodes blocking the high-voltage side of the second capacitor which is arranged in parallel with the second capacitor.

In order that the magnetic switches (saturable inductors) in the inversion circuit and compression circuit are always in the same state of magnetization at the start of every recharging process so that the delay time of the magnet switches is maintained constant and the pulse repetition frequency is stabilized, it is advantageous that all of the saturable inductors are connected in series with a DC source in a magnetic reversal circuit opposite to its polarity during the charging process, wherein a nonsaturable inductor is provided in each instance between the DC source and the saturable inductors. The DC source can also be a pulsed current source in an advisable further development.

In a particularly advantageous third embodiment, the saturable recharging inductor of the inversion charging circuit is arranged in a magnetic reversal circuit in series between the nonsaturable charging inductor and the ground potential of the inversion charging circuit, so that the charging process of the capacitor banks is used for the magnetic reversal of all saturable inductors.

The saturable inductors advantageously have core materials with suitable magnetization curves, wherein a ferrite or amorphous metal (e.g., finemet) is preferably used.

When the gas discharge for plasma generation is triggered by a preionization in the discharge chamber, it is advantageous that—when a separate transformer is provided for generating the preionization voltage—the primary winding of the transformer is provided simultaneously as a saturable recharge inductor.

A protection circuit for protecting the DC voltage source against reflected energy from the discharging circuit comprising the final capacitor bank and final saturable inductor of the compression circuit and the discharge gap in the discharge chamber is advantageously arranged between the DC voltage source and the LC inversion charging circuit.

In the protection circuit, an additional capacitor whose capacitance is much lower than the capacitance of the capacitor bank of the inversion charging circuit is advisably connected in parallel with the DC voltage source, and the high-voltage side of the DC voltage source is fed to the middle contact of the capacitor bank of the inversion charging circuit by a diode connected in the conducting direction and a parallel circuit comprising an inductor and a resistor, so that a lowpass filter is provided which additionally blocks a negative reflection voltage from the discharging circuit by means of the relatively inert diode.

In another advantageous arrangement of the protection circuit, an additional capacitor whose capacitance is much higher than the capacitance of the capacitor bank of the inversion charging circuit is connected in parallel with the DC voltage source, and the high-voltage side of the DC voltage source is fed to the middle contact of the capacitor bank of the LC inversion charging circuit via a diode connected in the conducting direction, an additional switch, and a parallel circuit comprising an inductor and a resistor so that, in addition to the protection of the DC voltage source, the pulse repetition frequency in the LC inversion charging circuit no longer depends on the dead time or idle time of the DC voltage source due to the high capacitance of the additional capacitor and the optional triggering of the additional switch.

It is possible by means of the circuit arrangement according to the invention to generate pulsed high-energy currents for a gas discharge pumped radiation source, i.e., electrical pulses of sufficient energy (preferably in the range of a few joules to 10 joules) and sufficient repetition rate (typically several kilohertz) and to achieve a stable generation of high voltage and a reliable voltage resetting using simple circuitry.

The invention will be described more fully in the following with reference to embodiment examples.

DESCRIPTION OF THE PREFERRED EMBODIMENTS

Figure 1:
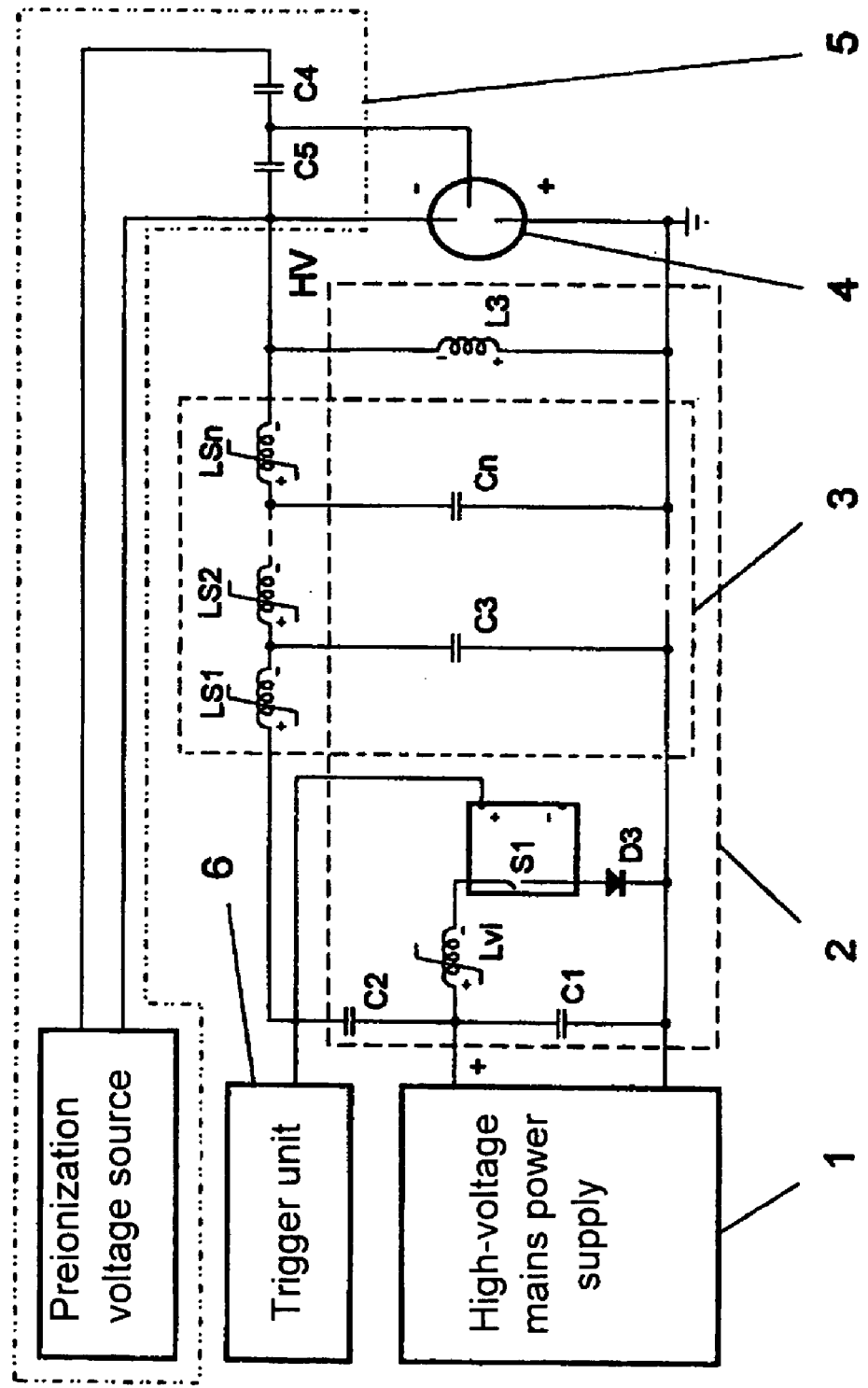
FIG. 1 shows a basic construction of the circuit arrangement according to the invention.

As is shown schematically in FIG. 1, the circuit arrangement according to the invention basically comprises a DC voltage source 1, an inversion charging circuit 2, a magnetic compression circuit 3, a discharge chamber 4, a preionization unit 5, and a trigger unit 6 for triggering the inversion charging circuit 2. The inversion charging circuit 2 has a two-part capacitor bank C1–C2 which serves to store the charge generated by the DC voltage source and in which an increase in voltage is carried out by means of an LC inversion of the charge stored in the first capacitor.

In order to generate the discharge voltage HV required for the gas discharge at the electrodes of the discharge chamber 4, the first capacitor C1 and second capacitor C2 of the capacitor bank C1–C2 are first charged by the charging inductor L3 to a positive high voltage of approximately ½ HV. By means of a switch S1, which is preferably constructed as an IGBT switch (e.g., from one or more switches of type EUPEC FZ1200R33KF2), the first capacitor C1 is recharged depending upon the saturated inductor Lvi and on the C1 capacitance value with a suitable time constant. The diode D3 which is connected in series with the switch S1 (and which can also comprise a plurality of diodes connected in parallel, e.g., EUPEC DD80033K2) prevents the current from flowing in the opposite direction at the conclusion of the first charging process in the inversion charging circuit 2. This portion of the circuit is the LC inversion circuit 2.

A winding can be used as recharging inductor Lvi and can also serve as the primary winding of a saturable preionization transformer Tr1 (see FIGS. 2a–c and 4a, 4b, 5 and 6) whose secondary winding supplies the high voltage for preionization. After the recharging process, the desired full discharge voltage HV is present at the capacitor bank C1–C2.

The charge stored in the capacitor bank C1–C2 is transferred to capacitor bank C3 by means of the saturable inductor LS1. The capacitor bank C3 discharges by means of the saturable inductor LS2—preferably via additional compression stages, each of which comprises a capacitor bank and a saturable inductor—into a final capacitor bank Cn whose discharge via a final saturable inductor LSn causes the actual gas discharge in the discharge chamber 4. The saturable inductors Ls1, Ls2, . . . , LSn serve to gradually reduce the current pulse (typically by a factor of about 10 to 20).

The capacitor banks C1–C2 and C3 to Cn are constructed in a modular manner so that their capacitance can easily be changed. The design of the capacitor banks C1–C2 and C3 to Cn is further characterized by a very low total inductance.

High-frequency resistant ceramic capacitors (e.g., TiO-based muRata DHS60-109N4700532K15KM6525) are preferably used. Polypropylene film capacitors (e.g., from the FKP1 series manufactured by WIMA (Germany) or capacitors produced by NOWACAP (USA)) can also be used for C1 and 2.

The gas discharge requires high current pulses of very short duration (approximately 100–500 ns). The conventional current pulses with a length of approximately 5 µs are shortened by means of the saturable inductors LS1 to LSn in the compression circuit 3 approximately by a factor of 10. The characteristic of the saturable inductors LS1 to LSn is determined by the magnetic behavior (B(H) characteristic) of the core material (e.g., amorphous metal such as finemet, or ferrite).

The saturable inductors LS1 to LSn are characterized by holding times (hold off capability). This is the time interval within which the inductance is not saturated. The holding times must be adjustable in a stable (reproducible) manner for optimum operation. For this purpose, the cores of all saturable inductors LS1 to LSn and Lvi are magnetically reversed by means of additional constant or pulsed currents.

For reasons of simplicity in the following drawings—and without limiting generality—the compression circuit 3 is shown with only one capacitor bank C3 and two saturable inductors LS1 and LS2.

A magnetic reversal circuit 7 provided for magnetic reversal (magnet switch resetting) can be designed in different ways. For one, according to FIG. 2a, a direct current from an additional DC source V1 can be applied to the magnetic reversal circuit 7, this direct current flowing through an additional auxiliary winding (or the primary winding) of all saturable inductors LS1, LS2 and Lvi arranged in series. The magnetic reversal circuit 7 is completed by the nonsaturable inductors L6 and L7.

Figure 2A:
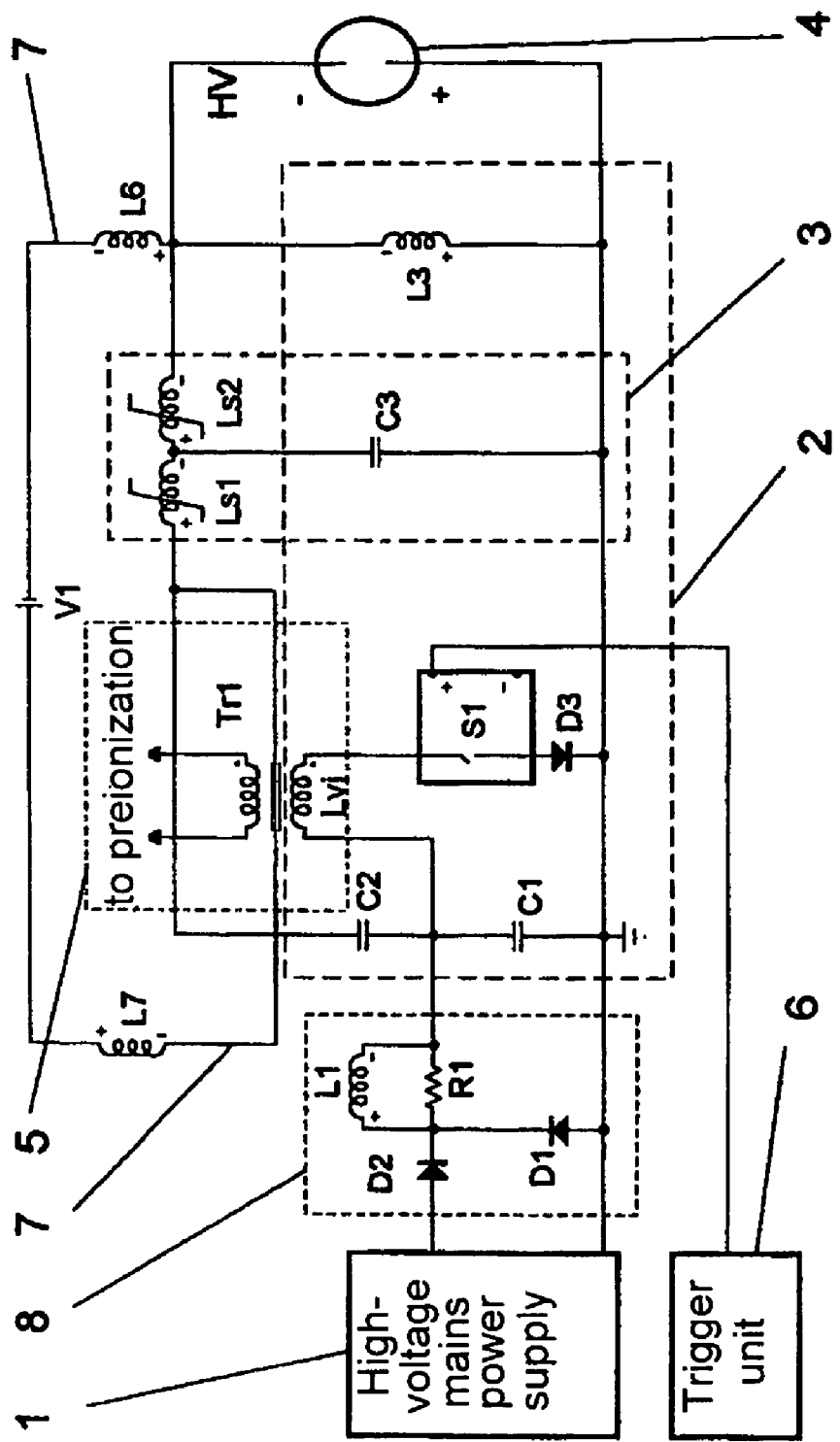
FIG. 2a shows a first circuit variant for resetting the saturable inductors in which the magnetic reversal is realized by means of an additional direct current through an auxiliary winding (or the principal winding) of the saturable inductors.
Figure 2B:
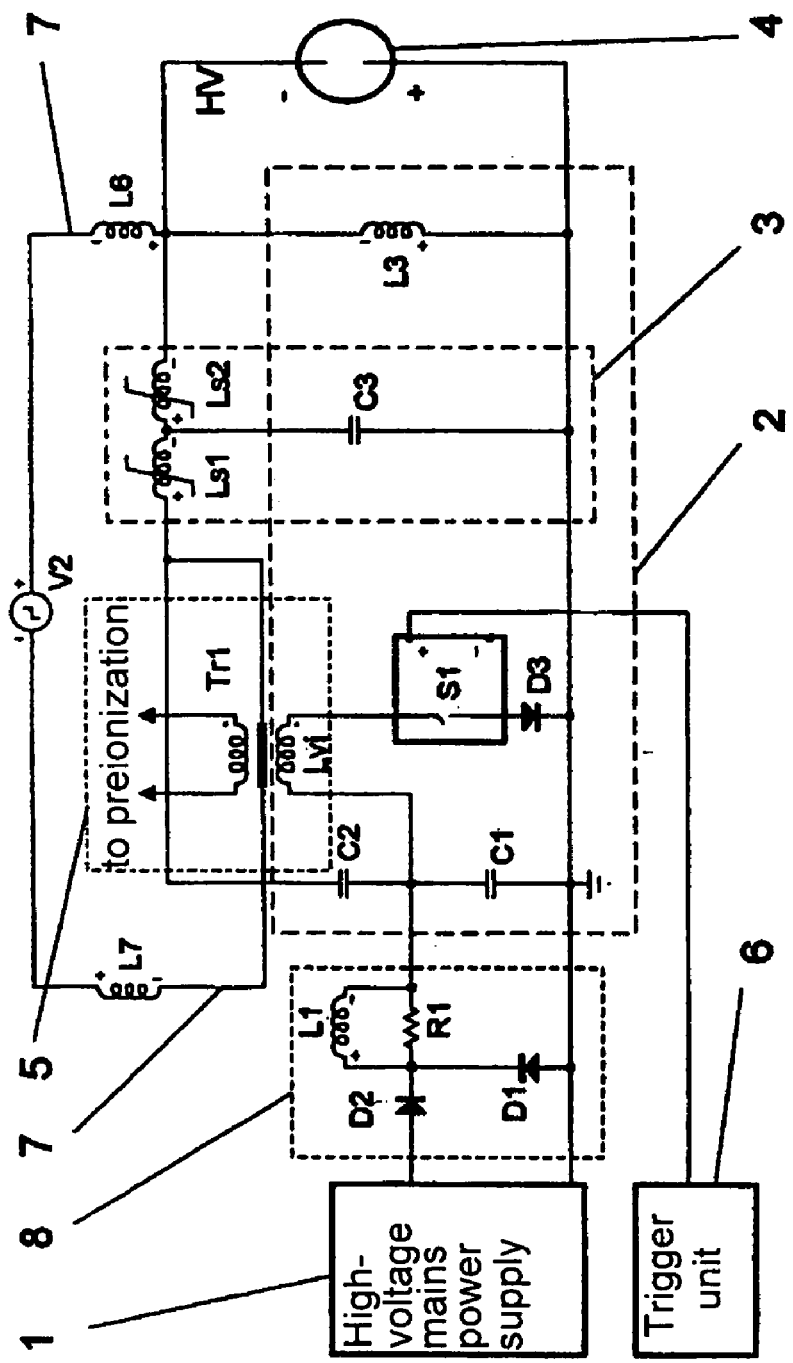
FIG. 2b shows a second circuit variant for resetting the saturable inductors in which a pulsed current flows through the saturable inductors and the magnetic reversal takes place in a directed during determined time intervals.

In another variant, as is shown in FIG. 2b, a pulsed current of a pulsed current source V2 flows through the magnetic reversal circuit 7 which in other respects corresponds to that shown in FIG. 2a, so that the magnetic reversal takes place in a directed manner during determined time intervals.

Figure 2C:
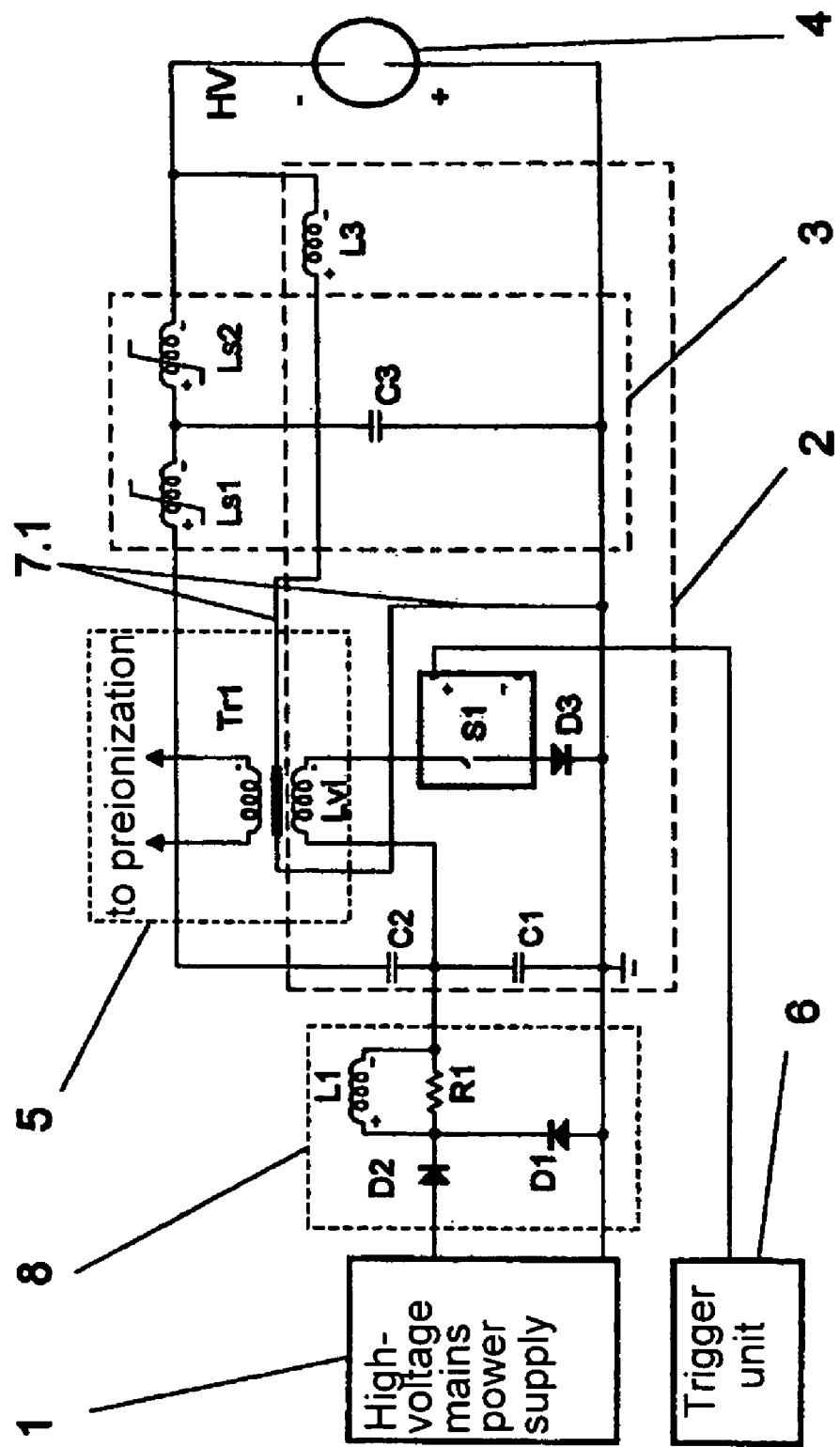
FIG. 2c shows a circuit variant for resetting the saturable inductors in which the magnetic reversal of the cores through the charging current is carried out during the charging

In a preferred variant corresponding to the circuit in FIG. 2c, the magnetic reversal is achieved in a particularly advantageous manner in that the charging current for the capacitor banks C1–C2 is used for magnetic reversal of the cores of the saturable inductors LS1, LS2 and Lvi. The magnetic reversal is carried out in this case during the charging process directly through the charging current. An integrated magnetic reversal circuit 7.1 is formed in that the charging inductor L3 is tied to the ground potential of the capacitor bank C1–C2 via the recharging inductor Lvi rather than directly.

In addition to the primary aim of a reproducible voltage increase by means of the recharging inductor Lvi, the process of magnetic reversal in all three types of magnetic reversal circuit 7 (including the integrated magnetic reversal circuit 7.1) causes the same initial inductance of the saturable inductors LS1 to LSn of the compression circuit 3 to always be adjusted and, therefore, a further reduction in pulse-to-pulse fluctuations in the pulsed currents in the discharge gap of the discharge chamber 4 is achieved.

Figure 5:
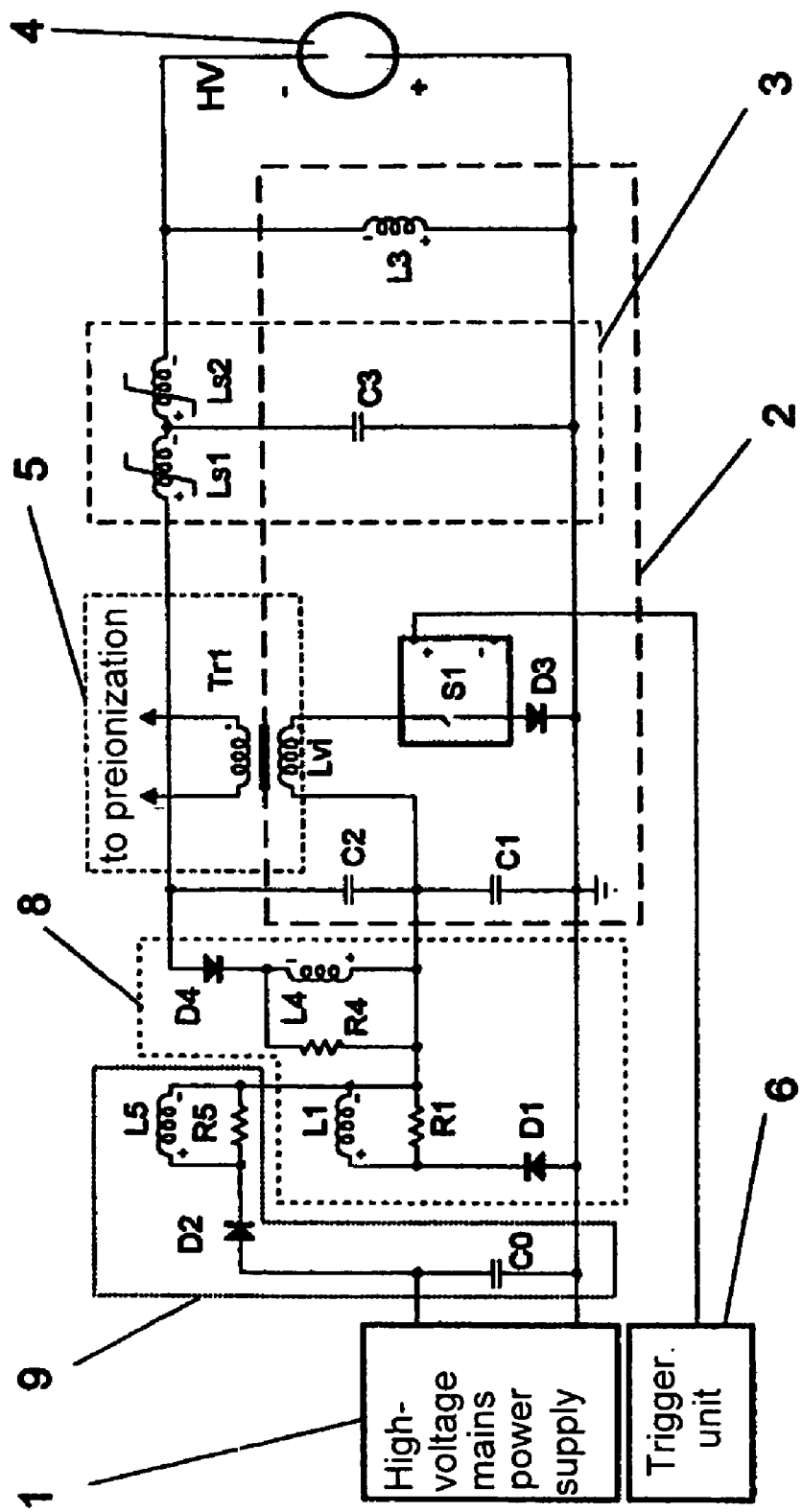
FIG. 5 shows a protection circuit for the mains power supply to protect against reflected high-voltage pulses.
Figure 6:
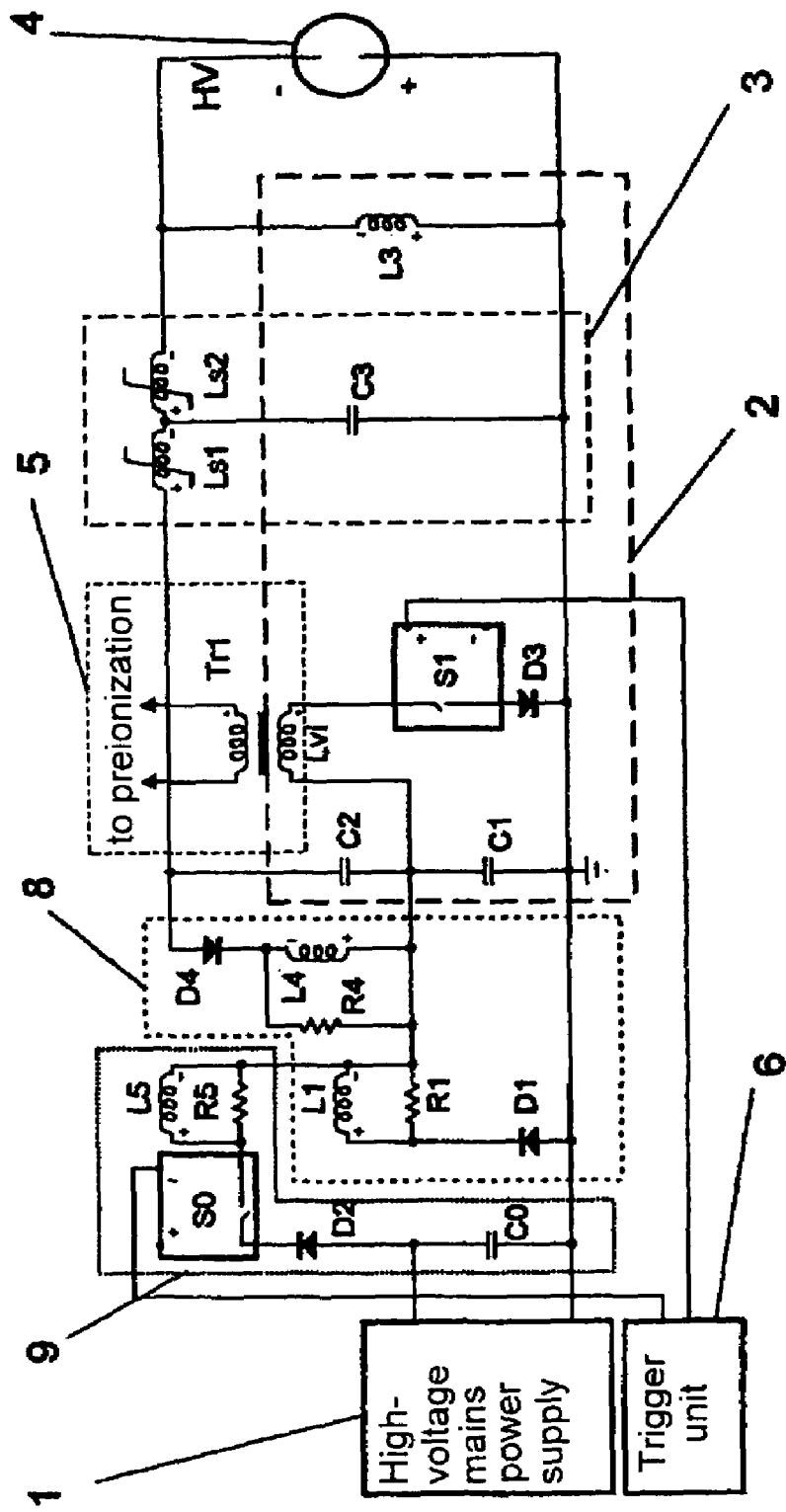
FIG. 6 shows a triggered protection circuit for the mains power supply to protect against reflected high-voltage pulses for overcoming the dependency of the repetition rate on the idle time of the DC voltage source.

An additional auxiliary circuit 8 for energy recovery, which anticipates the more complex constructions according to FIGS. 5 and 6, is indicated in the circuit arrangements with magnetic reversal (magnet switch resetting) according to FIGS. 2a–c. In this case, the (nonsaturable) inductor L1, together with the diode D1, forms a recharging circuit for the charge reflected by the discharge in the discharge chamber 4, where R1 acts as attenuating circuit. The diode D1 is accordingly part of the recovery circuit, while diode D2 has the function of protecting the DC voltage source 1 (high-voltage mains power supply) from the reflected currents. The inductor L1 serves, in addition to the function described above in the recharging process, as a current limiter during pulsed currents and accordingly protects the diode D2 and possibly a diode that may be present in the mains power supply (DC voltage source 1).

In the selected embodiment examples in FIGS. 2a–c, the gas discharge is triggered by a preionization pulse. The preionization transformer Tr1 which is provided for this purpose and which commonly provides the high voltage (typically 20 kV with electrical pulse energies of greater than 10 mJ) needed for preionization of the gas discharge is saturable and is used, in addition, to prevent commutation losses of the switch S1 by making use of the recharging current flowing in the primary winding in addition. The primary winding of the preionization transformer Tr1 accordingly serves at the same time as an inductance Lvi in the recharging circuit. Ferritic material or an amorphous metal (e.g., finemet) is used as material for the transformer core.

The present invention is particularly suited for optionally selecting the voltage sign (reversing polarity) at the electrodes of the discharge chamber 4. The polarity particularly influences the position of the plasma (i.e., the so-called pinch) and, therefore, the location of the EUV-emitting region. As an alternative to this, the circuit arrangements in FIG. 1 and FIG. 3 are used.

Figure 3:
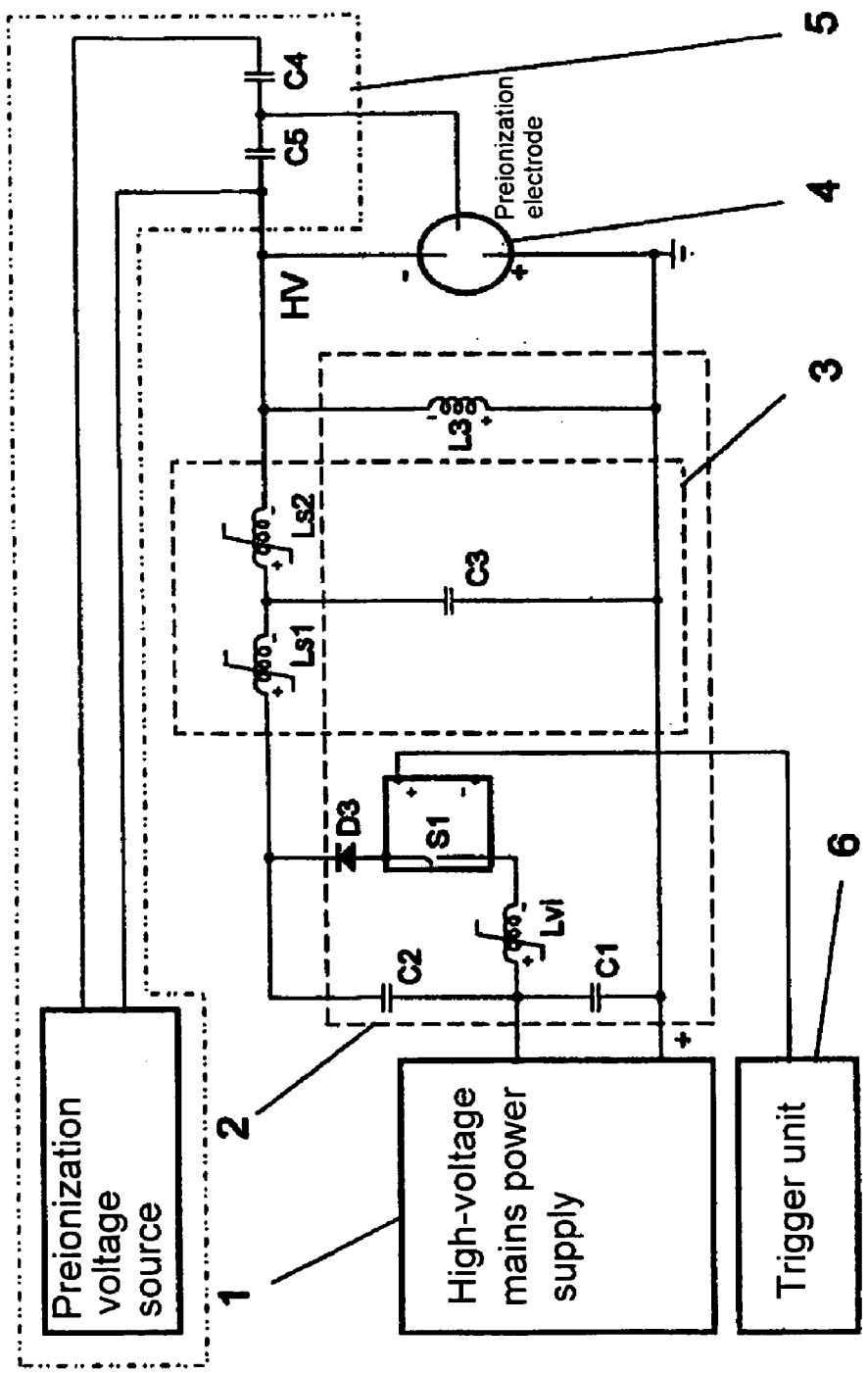
FIG. 3 shows an embodiment example of the circuit arrangement with voltage of reversed polarity at the discharge electrodes.

FIG. 3 differs from FIG. 1 in that a circuit element formed from Lvi, S1 and D3 is connected to the second capacitor C2 of the capacitor bank C1–C2 instead of to ground potential. As a result, when switch S1 is opened a recharging of the capacitor C2, which was previously negatively charged, takes place so that an approximately doubled positive charge voltage is applied to LS1 after the recharging process.

There are no substantial changes in the compression circuit and discharging circuit compared to the circuit shown in FIG. 1. However, the compression circuit 3 is shown in an abbreviated manner (as was already noted in connection with FIG. 3).

Accordingly, in practice, the polarity reversal in FIG. 3 consists only in that the diode D3 is reconnected from the ground contact of the first capacitor C1 to the second capacitor C2 at the other side of the capacitor bank C1–C2.

Only in the expanded auxiliary circuits 8 for energy recovery, which are indicated in FIGS. 4, 5 and 6 (each of which is constructed in accordance with the basic circuit in FIG. 1), must a diode D4 be additionally reversed in polarity in order to adapt the recovery for the second capacitor C2 to the positive discharge polarity.

In case of magnetic reversal by means of the charging current according to FIG. 2c (magnet switch resetting), there is no need to change the polarity of the integrated magnetic reversal circuit 7.1. This is the special advantage of this variant of magnet switch resetting.

Because of the known mismatch between the discharging circuit and the gas discharge gap, this discharging circuit comprising the capacitor bank C3, saturable inductor LS2 and electrodes of the discharge chamber 4, a portion of the energy in the discharging circuit is reflected back. A further reflection of energy in the gas discharge generates an additional load for the electrode system which shortens the life of the electrodes.

Figure 4A:
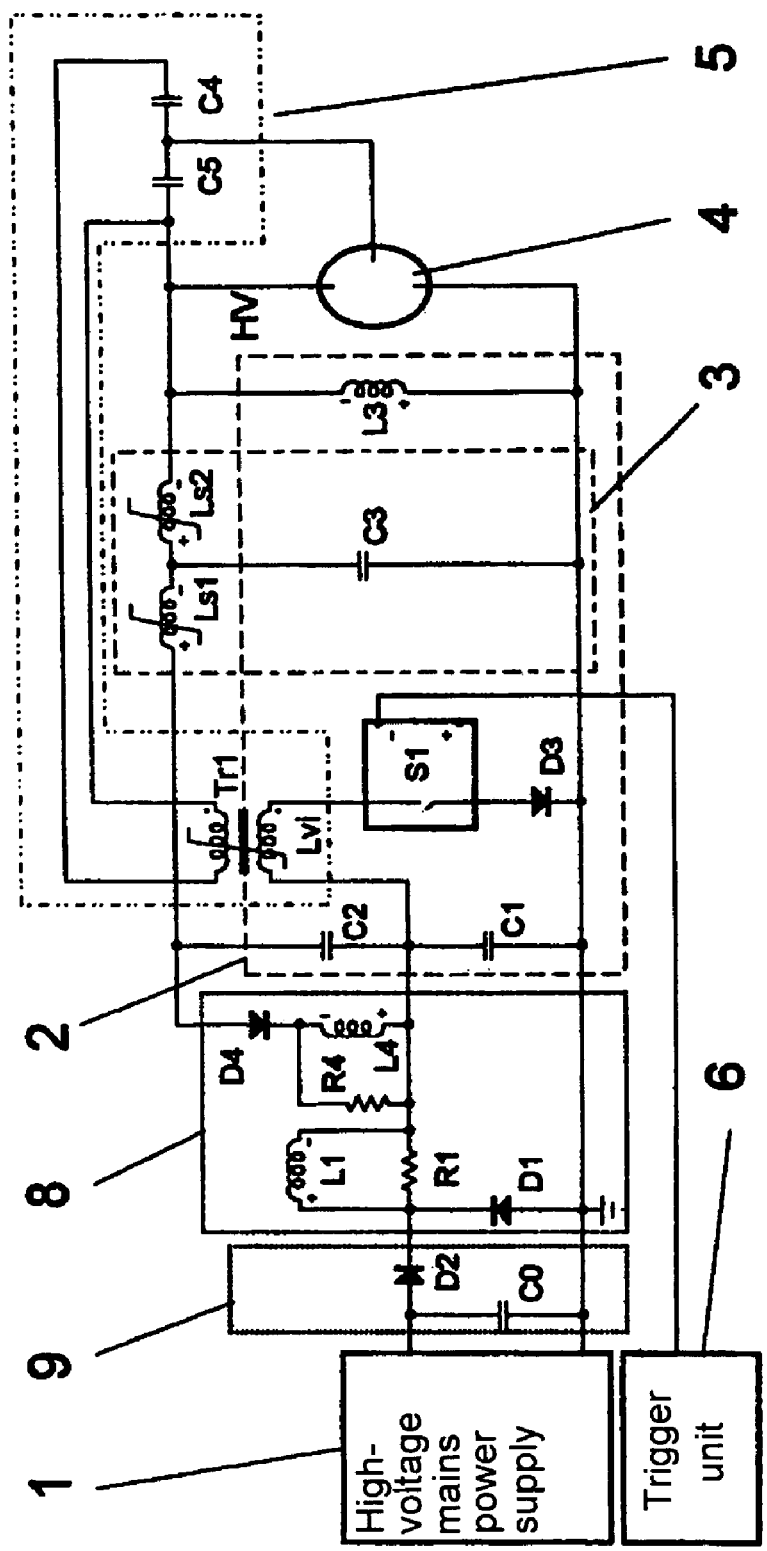
FIG. 4a shows a first design variant for energy recovery.

In order to increase the total efficiency of the discharging circuit and the life of the electrode system, an auxiliary circuit 8 is used according to FIG. 4a in order to prevent loading of the electrodes and, at the same time, to recover the reflected energy. This takes place in the following manner:

After every discharge of the capacitor bank C3 by means of the saturable inductor Ls2 and the discharge chamber 4, a positive voltage is present at C3. This voltage $U_{refl}$ corresponds to the reflected energy from the gas discharge. The capacitor bank C3 discharges via the saturable inductor Ls1 to the capacitor bank C1–C2. After this, voltage $U_{refl}$ lies between C2 and Ls1 and one half of voltage $U_{refl}$ lies between capacitors C1 and C2. At this point, the switch S1 is still closed and C1 recharges by means of the saturable inductor Lvi and S1 until the voltage between C2 and Ls1 is approximately 0. This sharply reduces or even eliminates the reflection of energy from the capacitor bank C1–C2 to the electrode system of the discharge chamber 4 via Ls1, C3 and Ls2.

At this point, the switch S1 is open. The energy remaining on capacitor bank C1–C2 is recovered as will be described in the following.

Before the process of energy recovery begins, negative voltage $-½ U_{refl}$ lies between C1 and C2. The capacitors C1 and C2 recharge simultaneously via diodes D1 and D4, inductors L1 and L4 and resistors R1 and R4. The voltage between C1 and C2 is positive, approximately $+½ U_{refl}$, and is available as recovered energy in capacitor bank C1–C2 for the next discharge.

Diode D4, resistor R4 and inductor L4, together with the second capacitor C2, form a recharging circuit which enables the recovery of the charge reflected back into capacitor C2. In so doing, a negative charge is generated from a positive charge in the capacitor C2 after recharging and is available for the next charging. Diode D1, resistor R1 and inductor L1 form a corresponding recharging circuit with respect to the first capacitor C1 as was used already in FIGS. 2a–c.

Figure 4B:
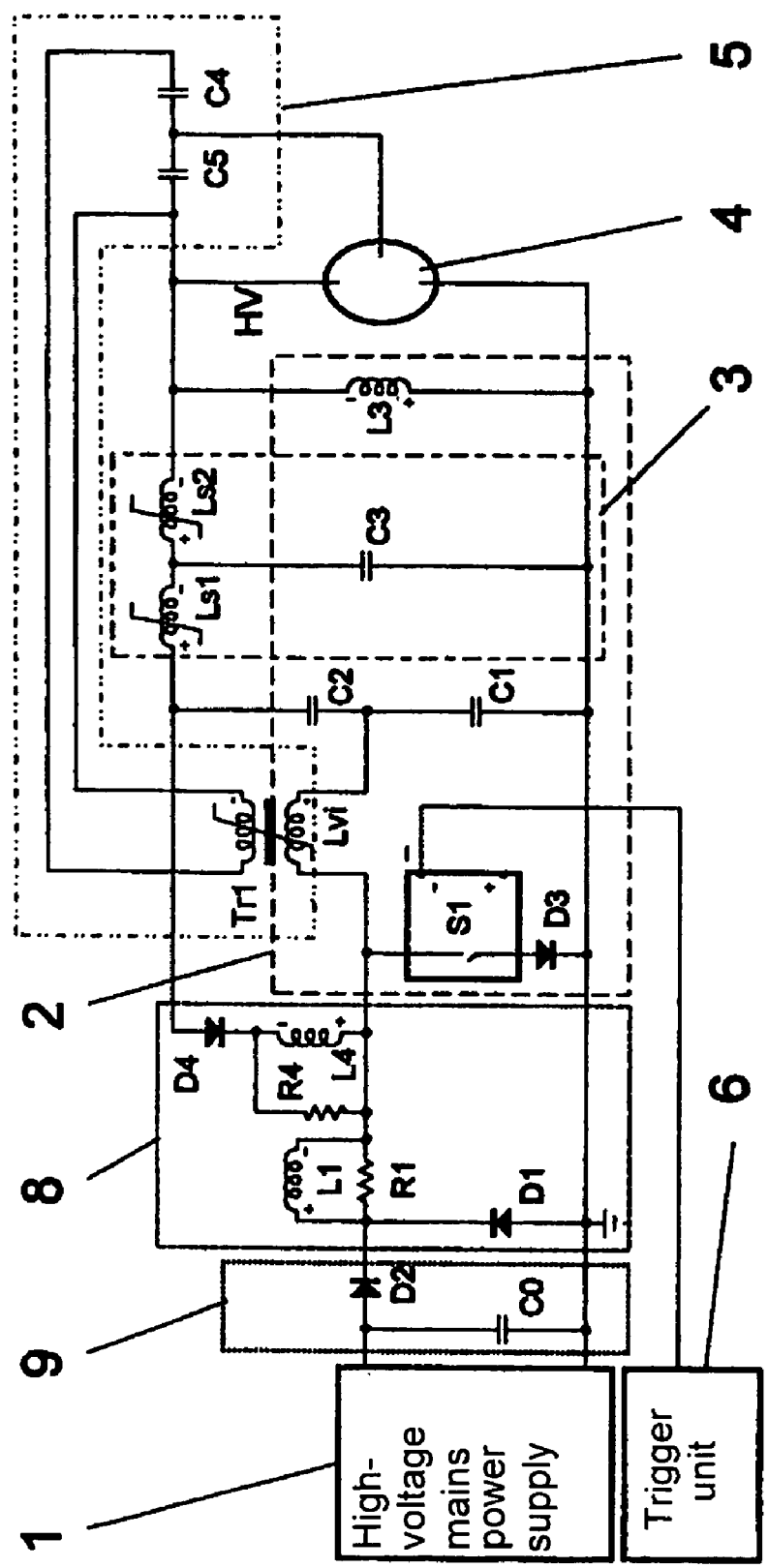
FIG. 4b shows another preferred design variant for energy recovery with a changed position of the recharging switch.

FIG. 4b shows an equivalent circuit variant for the circuit shown in FIG. 4a in which only the position of the recharging switch S1 in the inversion charging circuit 2 is changed. However, the recharging processes and the recovery of the reflected energy proceed in the same way as described above. Further, the resetting of the saturable inductors Lvi, Ls1 and Ls2 is achieved in the identically acting way as described in FIG. 2c.

Building upon FIGS. 2a–c, FIG. 5 shows a circuit arrangement which—as was already contained in FIGS. 4a and 4b as a basic variant—has a protection circuit 9 for the DC voltage source 1 to protect against reflected high-voltage pulses in the discharging circuit comprising capacitor bank C3, saturable inductor Ls2 and discharge chamber 4.

In this case, the protection circuit 9 for the DC voltage source 1 for protection against reflected high-voltage pulses contains an inductor L5, a resistor R5 and an additional capacitor C0 which form an LC lowpass filter under the condition that $$C0 >> C1, C2.$$

Further, the relatively inert diode D2 protects the DC voltage source 1 against the current from the negative high voltage $½ U_{refl}$ during the process of energy recovery.

For reasons of simplicity, the magnetic reversal circuit 7 or 7.1 is omitted from FIG. 5 (as well as FIG. 6). In principle, either magnetic reversal circuit 7 or 7.1 according to FIGS. 2a, 2b or 2c can be used.

In the circuit variant shown in FIG. 6, which is a further development of that shown in FIG. 5, the limit for the pulse repetition frequency which is conventionally given by the idle time of the DC voltage source 1 is shifted upward.

Another switch S0 and the additional capacitor C0 serve to increase the pulse repetition frequency under the condition that $$C0 \gg C1, C2.$$

The additional capacitor C0 deposits the energy from the DC voltage source 1 continuously and accordingly also charges the capacitor bank C1–C2 in a pulsed manner by means of the additional switch S0 during the idle time of the DC voltage source 1. In this case, the repetition frequency no longer depends upon the idle time of the DC voltage source 1, so that the pulse repetition frequency of the inversion charging circuit 2 can be increased appreciably.

While the foregoing description and drawings represent the present invention, it will be obvious to those skilled in the art that various changes may be made therein without departing from the true spirit and scope of the present invention.

REFERENCE NUMBERS

1 DC voltage source (high-voltage mains power supply)
2 inversion charging circuit
3 compression circuit
4 discharge chamber
5 preionization unit
6 trigger unit
7 magnetic reversal circuit
7.1 integrated magnetic reversal circuit
8 auxiliary circuit (for energy recovery)
9 protection circuit
C0 additional capacitor
C1,C2 first, second capacitor
C1–C2; C3 capacitor bank
C5 capacitor
D1, . . . , D4 diode
HV high voltage (for gas discharge)
L1, . . . , L7 nonsaturable inductor
Ls1, Ls2, Lvi saturable inductor
R1, . . . , R5 resistor
S0,S1 switch
Tr1 preionization transformer
V1 DC source
V2 pulsed current source

What is claimed is:

1. An arrangement for generating pulsed currents for gas discharge pumped radiation sources with a combination comprising:
   a voltage source;
   a charging circuit for a capacitor bank for generating voltage pulses;
   a magnetic compression circuit for shortening the pulse duration of the voltage pulses;
   a discharge chamber with two electrodes for the gas discharge; and
   a trigger unit for controlling the voltage pulse sequence;
   said charging circuit being an LC inversion charging circuit which communicates with a DC voltage source that provides only one half of the high voltage required for the gas discharge;
   said inversion charging circuit having two capacitors forming a capacitor bank;
   a first capacitor of the capacitor bank being arranged directly parallel to the DC voltage source and a second capacitor of the capacitor bank for being charged simultaneously by a nonsaturable charging inductor; and
   said first capacitor for being recharged by a switch communicating with the trigger unit by a saturable recharging inductor;
   wherein, after charging with the switch closed, a recharging of the first capacitor takes place with the switch open, as a result of which the full high voltage required for triggering a current pulse is provided at the capacitor bank, said current pulse being provided by said magnetic compression circuit for transfer to the electrodes for the gas discharge in said discharge chamber.

2. The arrangement according to claim 1, wherein the capacitor bank is constructed in a modular manner and is preferably formed of ceramic capacitors.

3. The arrangement according to claim 1, wherein the capacitor bank is constructed in a modular manner and is preferably formed of foil capacitors.

4. The arrangement according to claim 1, wherein the saturable inductors have core materials with suitable magnetization curves.

5. The arrangement according to claim 1, wherein the saturable inductors have a ferrite as core material.

6. The arrangement according to claim 1, wherein the saturable inductors have an amorphous metal, preferably finemet, as core material.

7. The arrangement according to claim 1, wherein when a gas discharge triggered by a preionization in the discharge chamber a transformer is provided for generating the preionization voltage, wherein the primary winding of the transformer is provided simultaneously as a saturable recharging inductor.

8. The arrangement according to claim 1, wherein the switch is a semiconductor switch.

9. The arrangement according to claim 8, wherein the switch is an IGBT switch.

10. The arrangement according to claim 8, wherein the switch is a thyristor.

11. The arrangement according to claim 1, wherein the switch is a gas discharge switch.

12. The arrangement according to claim 11, wherein the switch is a thyratron.

13. The arrangement according to claim 11, wherein the switch is a triggered spark gap.

14. The arrangement according to claim 1, wherein an auxiliary circuit for energy recovery of reflected discharge voltage that is reflected in the buffer-storage capacitor bank of the compression circuit after every gas discharge is provided between the DC voltage source for providing half of the discharge high voltage and the capacitor bank of the inversion charging circuit.

15. The arrangement according to claim 14, wherein an additional capacitor is connected in parallel with the DC voltage source, a first RL circuit with diodes blocking relative to the two poles of the DC voltage source and of the additional capacitor is connected to the common terminal of the first capacitor and second capacitor of the capacitor bank, and a second RL circuit with a diode blocking the high-voltage side of the second capacitor is arranged in parallel with the second capacitor.

16. The arrangement according to claim 14, wherein an additional capacitor is connected in parallel with the DC voltage source, a first RL circuit with diodes blocking relative to the two poles of the DC voltage source and of the additional capacitor is connected to the common terminal of the first capacitor and second capacitor of the capacitor bank, and a second RL circuit with a diode blocking the high-voltage side of the second capacitor is arranged parallel to the entire capacitor bank.

17. The arrangement according to claim 1, wherein a protection circuit for protecting the DC voltage source against reflected energy from the discharging circuit comprising capacitor bank and final saturable inductor of the compression circuit and the discharge gap of the discharge chamber is arranged between the DC voltage source and the inversion charging circuit.

18. The arrangement according to claim 17, wherein an additional capacitor whose capacitance is much lower than the capacitance of the capacitor bank of the LC inversion charging circuit is connected in parallel with the DC voltage source, and the high-voltage side of the DC voltage source is fed to the middle contact of the capacitor bank of the LC inversion charging circuit by a diode connected in the conducting direction and a parallel circuit comprising an inductor and a resistor, so that a lowpass filter is provided which additionally blocks negative reflection voltage from the discharging circuit by means of the relatively inert diode.

19. The apparatus according to claim 17, wherein an additional capacitor whose capacitance is much higher than the capacitance of the capacitor bank of the LC inversion charging circuit is connected in parallel with the DC voltage source, and the high-voltage side of the DC voltage source is fed to the middle contact of the capacitor bank of the LC inversion charging circuit via a diode connected in the conducting direction, an additional switch, and a parallel circuit comprising an inductor and a resistor so that, in addition to the protection of the DC voltage source, the pulse repetition frequency in the inversion circuit no longer depends on the idle time of the DC voltage source due to the high capacitance of the additional capacitor and the optional triggering of the additional switch.

20. The arrangement according to claim 1, wherein the magnetic compression circuit comprises a plurality of stages with saturable inductors and a further capacitor bank respectively interposed for temporary storage of the voltage pulses.

21. The arrangement according to claim 20, wherein the further capacitor bank is constructed in a modular manner and is preferably formed of ceramic capacitors.

22. The arrangement according to claim 20, wherein the further capacitor bank is constructed in a modular manner and is preferably formed of foil capacitors.

23. The arrangement according to claim 20, wherein the saturable inductors are connected in series with a DC source in a magnetic reversal circuit opposite to its polarity during the charging process, wherein a nonsaturable inductor is provided in each instance between the DC source and the saturable inductors.

24. The arrangement according to claim 20, wherein the saturable inductors are connected in series with a pulsed current source in a magnetic reversal circuit opposite to its polarity during the charging process, wherein a nonsaturable inductor is provided in each instance between the pulsed current source and the saturable inductors.

25. The arrangement according to claim 20, wherein the saturable inductor is arranged arranged in an integrated magnetic reversal circuit in series between the nonsaturable charging inductor and the ground potential of the inversion charging circuit, so that the charging process of the capacitor banks is used for the magnet switch resetting by magnetic reversal of all saturable inductors.

26. The arrangement according to claim 20, wherein the saturable inductors have core materials with suitable magnetization curves.

27. The arrangement according to claim 20, wherein the saturable inductors have a ferrite as core material.

28. The arrangement according to claim 20, wherein the saturable inductors have an amorphous metal, preferably finemet, as core material.

* * * * *